United States Patent

Velayudhan et al.

[11] Patent Number: 5,831,450
[45] Date of Patent: Nov. 3, 1998

[54] SYSTEM FOR IMPROVED RESPONSE TIME OUTPUT BUFFER UNIT HAVING INDIVIDUAL STAGES FOR SIGNAL GENERATION AND BUFFERING AND OUTPUT STAGE APPLYING SIGNAL DETERMINED BY INPUT SIGNAL

[75] Inventors: Biju Velayudhan, Trivandrum; Sadashiva Rao, Karnataka, both of India

[73] Assignee: Texas Instruments Incorporated, Dallas, Tex.

[21] Appl. No.: 656,502

[22] Filed: May 31, 1996

[30] Foreign Application Priority Data

Jun. 1, 1995 [IN] India ................................ 653/MAS/95

[51] Int. Cl.⁶ ........................ H03K 19/0948; G06F 13/20
[52] U.S. Cl. .......................... 326/83; 395/872; 327/333; 327/108; 326/27; 326/86; 326/121
[58] Field of Search ................................ 326/27, 83, 86, 326/121; 327/108, 333; 395/432, 872

[56] References Cited

U.S. PATENT DOCUMENTS

| | | | |
|---|---|---|---|
| 5,027,315 | 6/1991 | Agrawal et al. | 364/900 |
| 5,028,817 | 7/1991 | Patil | 326/27 |
| 5,042,004 | 8/1991 | Agrawal et al. | 364/900 |
| 5,097,149 | 3/1992 | Lee | 326/87 |
| 5,204,557 | 4/1993 | Nguyen | 307/475 |
| 5,291,454 | 3/1994 | Yamanaki et al. | 365/226 |
| 5,329,175 | 7/1994 | Peterson | 307/443 |
| 5,384,750 | 1/1995 | Lee | 365/233 |
| 5,625,308 | 4/1997 | Matsumoto et al. | 327/203 |
| 5,672,983 | 9/1997 | Yamamoto et al. | 326/27 |
| 5,684,410 | 11/1997 | Guo | 326/27 |

OTHER PUBLICATIONS

Patent Abstracts of Japan, vol. 10, No. 317 (E–449), 28 Oct. 1986 & JP–A–61 126818 (Pioneer).

Patent Abstracts of Japan, vol. 11, No. 376 (E–563). 8 Dec. 1987 & JP–A–62 144411 (Hitachi).

IBM Technical Disclosure Bulletin, vol. 30, No. 1, Sep. 1987, New York, US, pp. 1448–1450, XP002019159, "*Shift Register Latch Circuit with Predictable Transfer*".

*Primary Examiner*—Thomas C. Lee
*Assistant Examiner*—Rehana Perveen
*Attorney, Agent, or Firm*—W. James Brady, III; Richard L. Donaldson

[57] ABSTRACT

An output buffer unit for use with a dynamic random access memory includes a first stage for generating complementary logic signals. In an intermediate stage, separate from the generation of the complementary signals, the complementary signals are buffered for application to the output driver stages. By separation of the signal generation stages from the buffering stages, the speed of the logic level-to-logic level transitions can be increased.

10 Claims, 4 Drawing Sheets

SYSTEM FOR IMPROVED RESPONSE TIME OUTPUT BUFFER UNIT HAVING INDIVIDUAL STAGES FOR SIGNAL GENERATION AND BUFFERING AND OUTPUT STAGE APPLYING SIGNAL DETERMINED BY INPUT SIGNAL

BACKGROUND OF THE INVENTION

1. Field of the Invention

This invention relates to semiconductor data processing systems and, more particularly, to the output buffer unit of a dynamic random access memory unit. In the past, the output buffer unit would be driven to a logic state from an intermediate state or tristate. Recently, the output buffer unit, in selected transfers of blocks of data, the output buffer unit can be driven from a logic state to a complementary logic state. The output buffer units of the prior art are unable to execute the logic state to logic state transition in a manner resulting in acceptable performance.

2. Description of the Related Art

Referring to FIG. 1, an interface between a DRAM unit and the remainder of a data processing is shown. The central processing unit 1 exchanges logic signals with a control bus 6, an address bus 7, and a data bus 8. Logic signals from the address bus 7 are applied to latch unit 2 and memory controller 4. The address signals from latch unit 2 are applied to cache memory unit 3. Logic signals from the cache memory unit 3 are exchanged with the data bus 8. Signals from the control bus 6 and the address bus are applied to memory controller 4. The memory controller unit 4 applies the RAS_signal, the CAS_signal, the W_signal, and the address signals to tile DRAM unit 5. The DRAM unit exchanges data signals with the data bus 8.

Referring to FIG. 2, a block diagram of a DRAM unit, according to the prior art is shown. Address signals are applied to row address unit 20, which selects the row address information from the address signal group, and to column address unit 21, which selects the column address information from the address signal group. The output signals from the row address unit 20 are applied to the row address decoder 22, while the output signals from the column address unit 21 are applied to the column address decoder unit 23. The output signals from the from the row address decoder unit 22 and column address decoder unit 23 are applied to the memory cell array 24. Data signals from the DQ PAD 29 are applied to data input latch 28. Signals from the data input latch are exchanged with the driver unit 26. Signals from the driver unit 26 are applied to the memory cell array 24. Data signals from the memory cell array are applied to the prebuffer unit 25. Data signals from the prebuffer unit 25 are applied to the output buffer unit 27 and data signals from the output buffer unit 27 are applied to the DQ PAD 29.

Referring to FIG. 3, a schematic diagram of an output buffer, according to the prior art, is shown. The WOEN signal is applied to a gate terminal of n-channel transistor PMN1. A drain terminal of transistor PMN1 is coupled to a drain terminal of p-channel transistor PMP1, to a drain terminal of n-channel transistor PMN2, and to a gate terminal of p-channel transistor PMP2. A source terminal of transistor PMP1 is coupled to the substrate and to the Vpp voltage supply. A source terminal of transistor PMN1 is coupled to a WOEB_signal and to a gate terminal of n-channel transistor PMN4. A WOEN_signal is applied to a source and a gate terminal of transistor PMN2 and to a gate terminal of transistor PMN3. A source terminal of transistor PMN3 is coupled to a ground terminal, while a drain terminal of transistor PMN3 is coupled to a gate terminal of transistor PMP1, to a drain terminal of PMP2, to a drain terminal of transistor PMN4, to a gate terminal of n-channel transistor PMN5, to a gate transistor of p-channel transistor PMP3, to a gate terminal of p-channel transistor PMP4, and to a gate terminal of n-channel transistor PMN6. A drain terminal of transistor PMP2 is coupled to the Vpp voltage supply and to the substrate. A source terminal of transistor PMN4 is coupled to the ground potential. A source terminal of transistor PMP3 is coupled to the Vpp voltage supply and to the substrate. A drain terminal of transistor PMP3 is coupled to a first input terminal of logic NOR gate PNR1 and to a first conduction terminal of transistor PMN5. A second conduction terminal of transistor PMN5 is coupled to an input terminal of inverting amplifier PIV3 and to an output terminal of inverting amplifier PIV2.

A WDLAT signal is applied to an input terminal of inverting amplifier PIV1 and to an n-channel gate of passgate PPG1. The output terminal of inverting amplifier PIV1 is coupled to a p-channel gate of passgate PPG1. A first conduction terminal of passgate PPG1 is coupled to an output terminal of inverting amplifier PIV3, while a second conduction terminal of passgate PPG1 is coupled to an input terminal of inverting amplifier PIV2, to the IOPRBN signal and to a first conduction terminal of transistor PMN6. A second conduction terminal of transistor PMN6 is coupled to a drain terminal of transistor PMP4 and to a first input terminal of logic NOR gate PNR2. The source terminal of transistor PMP4 is coupled to the Vpp voltage supply and to the substrate. A second input terminal of logic NOR gate PNR2 is coupled to an output terminal of logic NOR gate PNR1, to a first terminal of resistor PR1, and to a first terminal of switch PSW1. The output terminal of logic NOR gate PNR2 is coupled to the second input terminal of logic NOR gate PNR1 and to a first conduction terminal of n-channel transistor PMN9. A gate terminal of transistor PMN9 is coupled to the Vpp voltage supply, while a second conduction terminal of transistor PMN9 is couple to a gate terminal of n-channel transistor PMNA. A source terminal of transistor PMNA is coupled to a second ground potential, while a drain terminal of transistor PMNA is coupled to a first terminal of resistor PR2, to a source terminal of n-channel transistor PMN7 and to a source terminal of n-channel transistor PMN8. A gate terminal of transistor PMN8 is coupled to the second ground potential, while the drain terminal of transistor PMN8 is coupled to a second terminal of resistor PR1, to second terminal of switch PSW1 and to an input terminal of transistor PMN7. The drain terminal of transistor PMN7 is coupled to a Vext voltage supply. A second terminal of resistor PR2 is coupled to the output terminal of the output buffer unit and the signal applied thereto is designated as the (DQN) signal.

The non-overlapping signals are generated in the prior art output buffer units are provided by cross-coupled logic NOR gates PNR1 and PNR2 (in FIG. 3). The output signals of logic NOR gates PNR1 and PNR2 activate the final driver circuits (including transistors PMN7 and PMNA). This technique is satisfactory when the predriver circuits make the transition from the tristate (0,0) level to the (0,1) or the (1,0) logic level. However, when the transition is from a (0,1) to a (1,0) level transition, or a (1,0) to a (0,1) transition, the time to make the logic-level-to-logic-level transition is lengthened. This delay is a result of the logic NOR gate not being as efficient as other circuit elements to drive the relatively large load of the output drivers.

A need has therefore been felt for an output buffer circuit that can drive a logic-level-to-logic-level transition in the output buffer with higher response times than are available in circuits presently available.

SUMMARY OF THE INVENTION

The aforementioned and other features are accomplished, according to the present invention, by an output buffer unit in which the complementary logic signals are generated prior to and separate from the buffering required to drive the output stages. The output buffer unit includes a first stage in which the data in latched in the stage and control signals are processed. Complementary signals are applied to a second stage, the second stage and a third stage buffering the signals for application to a fourth and final driver stage. In this manner, a logic state to logic state transition can be implemented without the loss of performance of the prior art devices.

These and other features of the present invention will be understood upon the reading of the Specification in conjunction with the Figures.

DESCRIPTION OF THE PREFERRED EMBODIMENT (S)

DETAILED DESCRIPTION OF THE DRAWINGS

Figure 1:
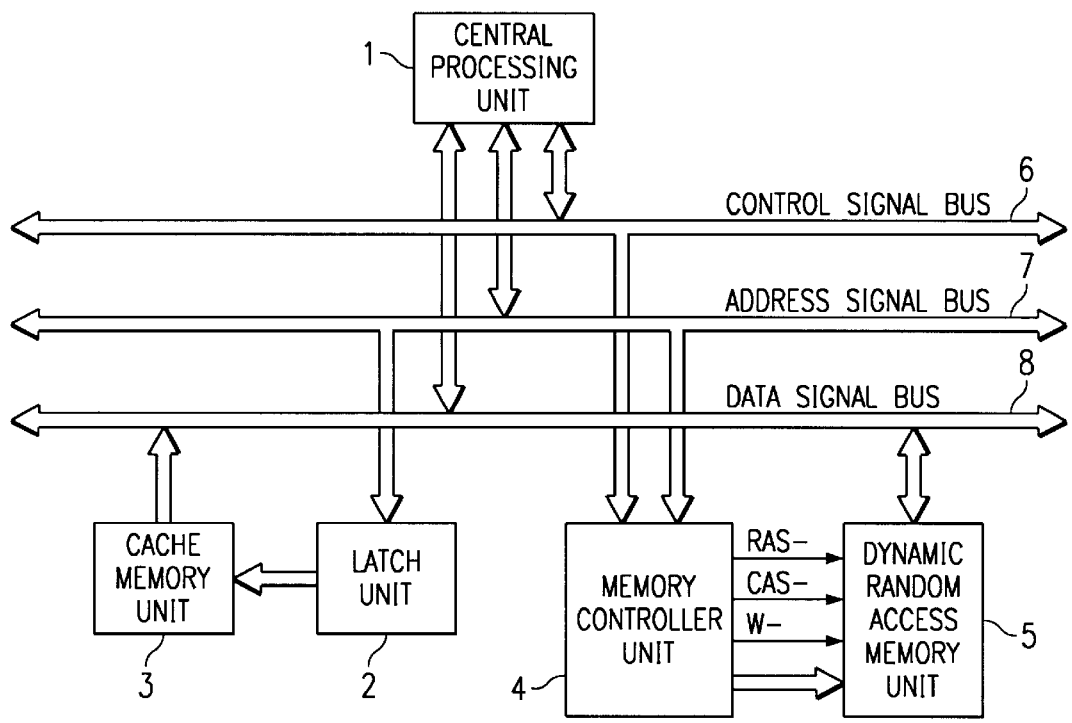
FIG. 1 is a block diagram of a data processing system illustrating the interface with a dynamic random access memory according to the prior art.
Figure 2:
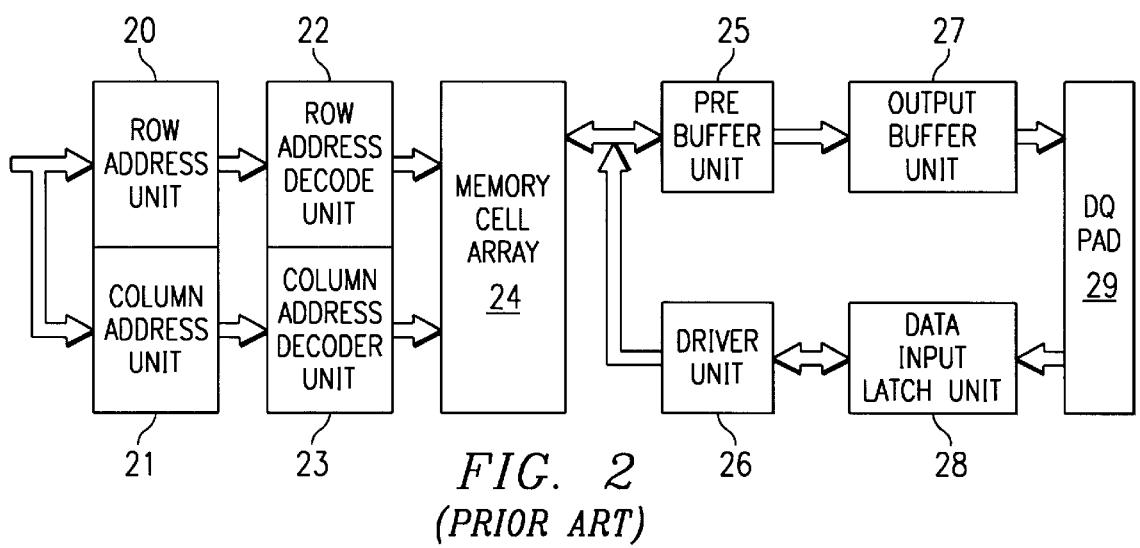
FIG. 2 is a block diagram of the DRAM unit of a data processing system according to the prior art.
Figure 3:
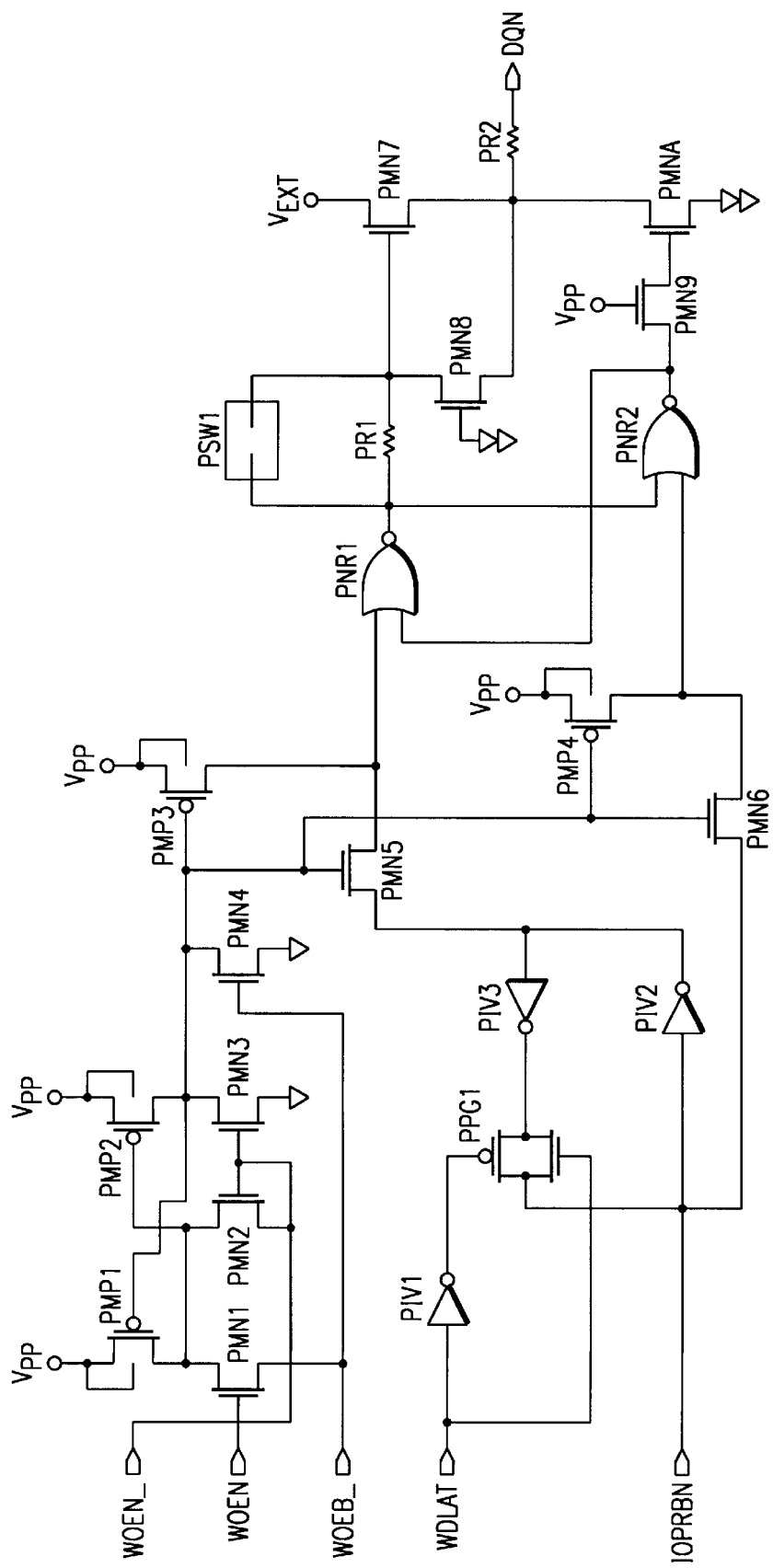
FIG. 3 is a schematic diagram of an output buffer unit according to the prior art.

FIGS. 1, 2, and 3 have been discussed with respect to the related art.

Figure 4:
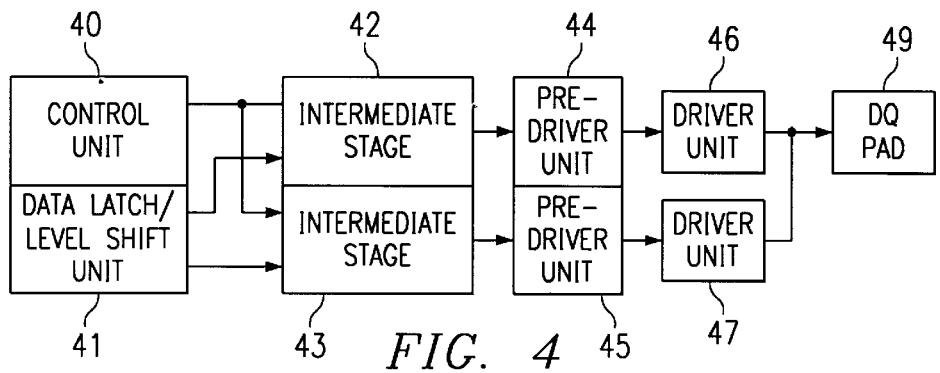
FIG. 4 is a block diagram of an output buffer unit, for use in a DRAM memory unit, according to the present invention.

Referring to FIG. 4, a block diagram of an output buffer unit, according to the present invention is shown. Control unit 40 and data latch/level shift unit 41 each applies signals to intermediate stage 42 and intermediate stage 43. Intermediate stage 42 applies signals to pre-driver unit 44, while intermediate stage 43 applies signals to pre-driver unit 45. Pre-driver unit 44 applies signals to driver unit 46, while pre-driver unit 45 applies signals to driver unit 47. Driver unit 46 and driver unit 47 apply signals to DQ Pad 49.

Figure 5:
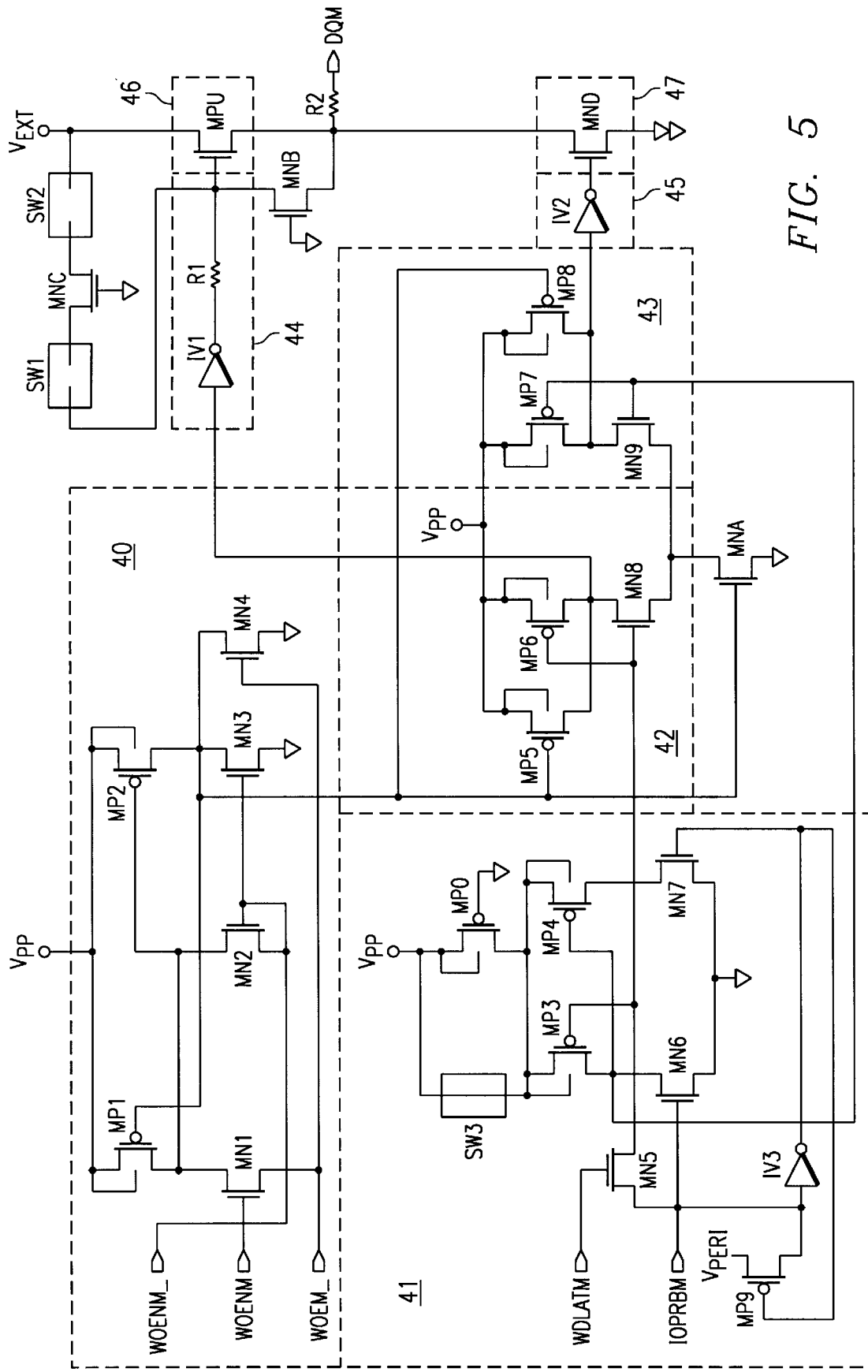
FIG. 5 is a schematic diagram of an output buffer according to the present invention.

Referring to FIG. 5, a schematic diagram of the output buffer according to the present invention is shown. The WOENM signal is applied to a gate terminal of n-channel transistor MN1. A WOEM_signal is applied to a source terminal of transistor MN1 and to a gate terminal of n-channel transistor MN4. A WOENM_signal is applied to a source terminal of n-channel transistor MN2, to a gate terminal of transistor MN2, and to a gate terminal of transistor MN3. A drain terminal of transistor MN1 is coupled to a drain terminal of p-channel transistor MP1, a drain terminal of transistor MN2, and a gate terminal of p-channel transistor MP2. A source terminal and the substrate of transistor MP1 and a source terminal and substrate of transistor MP2 are coupled to the supply voltage Vpp. A gate terminal of transistor MP1 is coupled to a terminal of transistor MN3, to a drain terminal of transistor MN4, to a gate terminal of p-channel transistor MP5, to a gate terminal of n-channel transistor MNA, to a gate terminal of p-channel transistor MP8. The source terminal of transistor MN3 and the source terminal of transistor MN4 are coupled to the ground potential.

A WDLATM signal is applied to a gate terminal of n-channel transistor MN5. An IOPRBM signal is applied to a first conduction terminal of transistor MN5, a gate terminal of n-channel transistor MN6, a drain terminal of p-channel transistor MP9, and an input terminal of inverting amplifier IV3. A source and substrate of transistor MP9 are coupled to Vperi, while a gate terminal of transistor MP9 is coupled to an output terminal of inverting amplifier IV3 and a gate terminal of n-channel transistor MN7. A source terminal of transistor MN6 and a source terminal of transistor MN7 are coupled to the ground potential. A second conduction terminal of transistor MN5 is coupled to a gate terminal of p-channel transistor MP3, to a drain terminal of transistor MN7, to a drain terminal of p-channel transistor MP4, to a gate terminal of n-channel transistor MN8, and to a gate terminal of p-channel transistor MP6. A drain terminal of transistor MN6 is coupled to a drain terminal of transistor MP3 and to a gate terminal of transistor MP4. A substrate and a source terminal of transistor MP3 are coupled through switch SW3 to the Vpp voltage supply, to a drain terminal of p-channel transistor MP0, and to a substrate and source terminal of transistor MP4. A gate terminal of transistor MP0 is coupled to ground potential, while a source terminal and substrate of transistor MP0 are coupled to the Vpp voltage supply.

A substrate and source terminal of transistor MP5 is coupled to a source terminal and substrate of transistor MP6, to a source terminal and substrate of p-channel transistor MP7, to a source terminal and substrate of transistor MP8 and to the Vpp voltage supply. A drain terminal of transistor MP5 is coupled to a drain terminal of transistor MP6, to a drain terminal of transistor MN8, and to and input terminal of transistor IV1. A drain terminal of transistor MNA is coupled to source terminal of transistor MN8 and a source terminal of n-channel transistor MN9, while a source terminal of transistor MNA is coupled to the ground potential. A drain terminal of transistor MN9 is coupled to a drain terminal of transistor MP7, to a drain terminal of transistor MP8, and an input terminal of inverting amplifier IV2, A gate terminal of transistor MN9 is coupled to a gate terminal of transistor MP7 and to a gate terminal of transistor MP4.

An output terminal of inverting amplifier IV2 is coupled to a gate terminal of n-channel transistor MND. A source terminal of transistor MND is coupled to a second ground potential, while a drain terminal of transistor MND is coupled to a first terminal of resistor R2, to a source terminal of n-channel transistor MNB, and to a source terminal of n-channel transistor MNU. A gate terminal of transistor MNB is coupled to the ground potential, while a drain terminal of transistor MNB is coupled to a first terminal of switch SW1, to a gate terminal of transistor MPU, and is couple through resistor R1 to an output terminal of inverting amplifier IV1. A drain terminal of transistor MNU is coupled to a Vext voltage supply and to a first terminal of switch SW2. A second terminal of switch SW1 is coupled to a first conduction terminal of n-channel transistor MNC, while a second terminal of switch SW2 is coupled to a second conduction terminal of transistor MNC. A gate terminal of transistor MNC is coupled to the ground potential. A second terminal of resistor R2 provides the output signal DQM.

Figure 6:
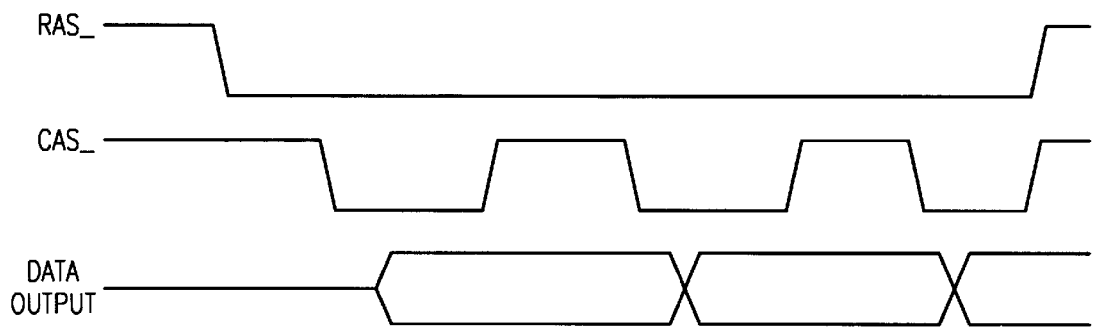
FIG. 6 is a graph illustrating the results of a simulation comparing signals of the prior art output buffer with signals of the output buffer unit of the present invention.

Referring to FIG. 6, a typical extended data output is shown. During the extended data output, when the CAS_ signal makes high transition, the previous data maintained at the output terminal. This previous data is maintained at the output even after the CAS_signal goes low for a minimum data hold time (TDOH). When the next access is a TCAC access and the new data is the opposite logic state, then the output buffer circuit will result in a logic-level-to-logic level transition.

OPERATION OF THE PREFERRED EMBODIMENTS (S)

Referring once again to the block diagram of the output buffer unit shown in FIG. 4, the control unit 40 combines output enable control signals and generates a level-shifted control signal. Data latch/level shift unit 41 latches the incoming data and provides a shift in the level of the latched data signals. To obtain an appropriate level at the output terminal of the dynamic random access unit, the output driver units 45 and 47 are driven with a level greater than the internal supply level. Hence the level shifting performed by data latch/level shift unit 41 transforms the incoming voltage level to a higher one. Cross-coupled transistors in data latch/level shifter 41 are used to generate complementary signals. In addition, the complementary signals are non-overlapping. The non-overlapping of the complementary signals is essential to minimize the crowbar current. In the intermediate stages 42 and 43, control (output enable) signals from the control unit 40 is gated with the data signals from data latch/level shifter and to pass, with minimum delay, the non-overlapping, complementary signals to the pre-driver units 44 and 45. The intermediate stages 42 and 43 are (0,0) for a tristate output and (1,0) or (0,1) for the output data signals. Pre-driver units 44 and 45 include inverter components for providing optimal activation signals for the driver units 46 and 47. The components 42, 43, 44, and 45 are optimized to maintain the non-overlapping characteristic of the complementary signals generated by control unit 40.

The WOEN and WOEN_(and WOENM and WOENM_) signals are complementary output enable control signals. The WOEB_(and WOEM_) signal is an output enable signal which is related to the column address transition and indicates that the new data is ready at the input terminals of the output buffer. The WDLAT signal is a data latch signal. When the WDLAT signal goes to the low state, the latch circuit is disabled and the input data from the IOPRBN is entered in the latch unit. When the WDLAT signal goes to the high state, the data of the IOPRBN signal is latched in the latch unit. (The WDLATM is related to the WDLAT signal.) The DQN (and the DQM) signal is the output data.

In the output buffer according to the present invention, the non-overlapping signals are generated in the a first stage in order to isolate non-overlap signal generation from the apparatus used to drive the high load. Once the complementary signals are generated, then appropriate buffering can be achieved without disturbing the non-overlap portion of the signal generation.

The data latch/level shift unit 41 shifts the input data level from the Vperi voltage supply levels to the higher Vpp voltage supply levels. These voltage levels are used for driving the following portions of the output buffer unit to avoid degradation in the final output levels. The final portion of the output buffer unit is powered by the Vext voltage supply and, therefore, the DQ output levels are determined by the Vext voltage supply.

The first stage is designed by taking into consideration the allowable supply voltage range, the process corner variations reflected in the simulation (spice) models used, and the effects of temperature variations over the required variation. These optimization procedures have decreased the speed in the path 41→42→44 and the path 41→43→45 by approximately 2 ns.

Figure 7:
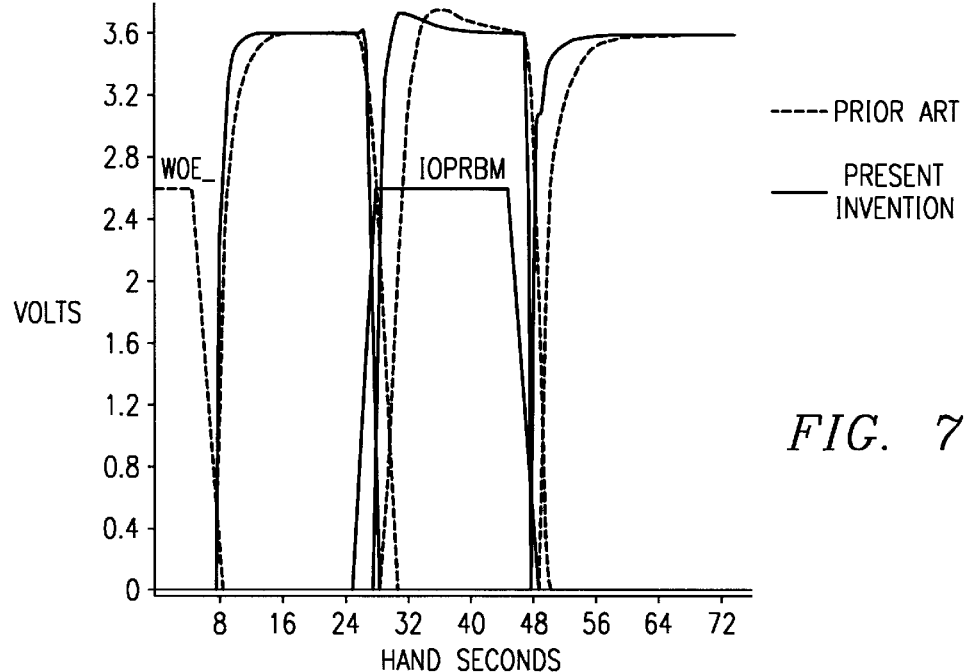
FIG. 7 is a graph illustrating the results of a simulation comparing the ringing of the prior art output buffer unit with the ringing in the output buffer unit of the present invention.

Referring to FIG. 7, the results of a simulation comparing the performance of the prior art output buffer unit with the performance of the output buffer unit according to the present invention. The solid waveforms indicate the signals which activate the final driver units of the present invention, while the dotted lines indicate the waveform for the prior art buffer units.

With respect to the switches, switch PSW1 in FIG. 3 was originally used to by-pass resistor PR1, but has proved to be unnecessary. In FIG. 5, SW1 and SW2 were provided for experimental reasons and are currently not being used in the preferred embodiment. When switch SW3 is open, the complementary output signals can be made more non-overlapping, thereby decreasing the crowbar current and the ringing in the output signal. This improvement is accomplished at the expense of circuit speed.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. An output buffer unit for use with a dynamic random access memory, said output buffer unit comprising:
    a first stage responsive to data signals and control signals for generating complementary logic signals;
    a second stage responsive to said complementary logic signals for buffering said complementary signals, said stage including two inverting amplifier predrivers stages; and
    an output stage responsive to buffered signals from said second stage for applying a logic signal to an output terminal.

2. The output buffer unit of claim 1 wherein said output stage includes two driver units.

3. The output buffer unit of claim 2 wherein said second stage includes two intermediate stages.

4. The output buffer unit of claim 3 wherein said first stage includes:
    a latch and level shift for receiving data signals and applying complementary data signals to said two intermediate stages; and a control unit for receiving control signals and for applying control signals to said intermediate stages.

5. A method of processing signals in an output buffer unit of a dynamic random access memory unit, said method comprising the steps of:

generating complementary data signals in response to an input data signal and control signals;

in a separate stage of said output buffer unit, generating buffered complementary data signals;

in response to said buffered complementary data signals, driving an output terminal to a logic state determined by said input data signal.

6. The method of claim 5 wherein said generating buffered complementary data signals step includes the step of generating each buffered complementary data signal in a separate stage.

7. An output buffer unit for use in a dynamic random access memory, said output buffer unit comprising:

complementary means responsive to control signals and an input data signals for generating complementary data signals;

buffer means separate from said complementary means and responsive to said complementary data signals for providing buffered complementary data signals; and driver means responsive to said buffered complementary data signals for applying a logic state signal to an output terminal, said logic state signal determined by said input data signal.

8. The output buffer unit of claim 7 wherein said complementary means includes:

a control means responsive to said control signals for generating a first control signal, said first control signal being applied to said buffer means; and a data means for latching and level shifting said input data signal, said data means applying said complementary data signals to said buffer means.

9. The output buffer unit of claim 8 wherein said buffer means includes a first and a second buffer component, each buffer component receiving one of said complementary data signals, each buffer component providing a one of said buffered complementary data signals.

10. The output buffer unit of claim 9 wherein said data means includes an first and a second driver component, each driver component having a buffered complementary data signal applied thereto, each driver component applying a signal to an output terminal, said output terminal having a logic state signal applied thereto determined by said input data signal.

* * * * *